United States Patent
Goto et al.

(10) Patent No.: US 8,578,777 B2
(45) Date of Patent: Nov. 12, 2013

(54) METHOD FOR QUANTITATIVELY EVALUATING CONCENTRATION OF ATOMIC VACANCIES EXISTING IN SILICON WAFER, METHOD FOR MANUFACTURING SILICON WAFER, AND SILICON WAFER MANUFACTURED BY THE METHOD FOR MANUFACTURING SILICON WAFER

(75) Inventors: Terutaka Goto, Niigata (JP); Hiroshi Kaneta, Niigata (JP); Yuichi Nemoto, Niigata (JP); Mitsuhiro Akatsu, Niigata (JP)

(73) Assignee: Niigata Univerasity, Niigata (JP)

( * ) Notice: Subject to any disclaimer, the term of this patent is extended or adjusted under 35 U.S.C. 154(b) by 64 days.

(21) Appl. No.: 13/394,705

(22) PCT Filed: Aug. 19, 2010

(86) PCT No.: PCT/JP2010/063967
§ 371 (c)(1),
(2), (4) Date: Mar. 7, 2012

(87) PCT Pub. No.: WO2011/027670
PCT Pub. Date: Mar. 10, 2011

(65) Prior Publication Data
US 2012/0168912 A1    Jul. 5, 2012

(30) Foreign Application Priority Data

Sep. 7, 2009  (JP) ................................ 2009-206397

(51) Int. Cl.
*G01N 29/07* (2006.01)
(52) U.S. Cl.
USPC ................................. 73/597; 73/606; 73/632
(58) Field of Classification Search
USPC ......................................... 73/597, 606, 632
See application file for complete search history.

(56) References Cited

U.S. PATENT DOCUMENTS

| 8,215,175 B2 * | 7/2012 | Goto et al. ....................... 73/632 |
| 2010/0186512 A1 * | 7/2010 | Goto et al. ....................... 73/632 |

FOREIGN PATENT DOCUMENTS

| JP | 07-174742 | 7/1995 |
| JP | 2009-033102 | 2/2009 |
| WO | WO 2007100155 | 9/2007 |

OTHER PUBLICATIONS

Watanabe, et al., The Observation of Vacancy in Silicon Crystal by using Ultrasonic Measurements at Low Temperature, Meeting Abstract of the Physical Society of Japan, vol. 63, No. 2 (2008, Autumn Meeting), 4 Part.
PCT/JP2010/063967, International Search Report, 4 pages.

* cited by examiner

*Primary Examiner* — J M Saint Surin
(74) *Attorney, Agent, or Firm* — Novak Druce Connolly Bove +Quigg LLP

(57) ABSTRACT

A quantitative evaluation method, a method for manufacturing a silicon wafer, and a silicon wafer manufactured by the method, enabling more efficient evaluation of the concentration of atomic vacancies existing in a silicon wafer. The quantitative evaluation method includes steps of: oscillating, in a state in which an external magnetic field is applied to a silicon wafer (26) while keeping the silicon wafer (26) at a constant temperature, an ultrasonic wave pulse and receiving a measurement wave pulse obtained after the ultrasonic wave pulse is propagated through the silicon wafer (26) for detecting a phase difference between the ultrasonic wave pulse and the measurement wave pulse; and calculating an elastic constant from the phase difference. The external magnetic field is changed to calculate the elastic constant corresponding to a change in the external magnetic field for evaluating a concentration of atomic vacancies in the silicon wafer (26).

6 Claims, 8 Drawing Sheets

METHOD FOR QUANTITATIVELY EVALUATING CONCENTRATION OF ATOMIC VACANCIES EXISTING IN SILICON WAFER, METHOD FOR MANUFACTURING SILICON WAFER, AND SILICON WAFER MANUFACTURED BY THE METHOD FOR MANUFACTURING SILICON WAFER

CROSS-REFERENCE TO RELATED APPLICATIONS

This Application claims priority to Japanese Patent Application No. 2009-206397, filed Sep. 7, 2009, and is a 371 U.S. National Stage application of PCT Application No. PCT/JP2010/063967, filed on Aug. 19, 2010, entitled "METHOD FOR QUANTITATIVELY EVALUATING CONCENTRATION OF ATOMIC VACANCIES EXISTING IN SILICON WAFER, METHOD FOR MANUFACTURING SILICON WAFER, AND SILICON WAFER MANUFACTURED BY THE METHOD FOR MANUFACTURING SILICON WAFER," the entire contents of which are incorporated herein by reference.

TECHNICAL FIELD

The present invention relates to a quantitative evaluation method, a method for manufacturing a silicon wafer, and a silicon wafer manufactured by the method for manufacturing a silicon wafer that can quantitatively evaluate the concentration of atomic vacancies in a silicon crystal wafer manufactured by the Czochralski method (the CZ method) or the floating zone method (the FZ method) used in the semiconductor industries.

BACKGROUND ART

In recent years, semiconductor devices (LSI: Large Scale Integration) represented by a DRAM or a flash memory have increasingly expanded functionality and improved quality in association with highly sophisticated communication devices or the like, and demands for semiconductor devices has been rapidly increasing (doubled in two years) due to the widespread use of mobile telephones and portable music players. Accordingly, demands for silicon wafers, which are a material of semiconductor devices, are also rapidly increasing. There is sought a technique that can efficiently produce high quality silicon wafers, in order to meet demands expected to increase in future.

In this connection, in the semiconductor industries, silicon wafers are generally manufactured by the Czochralski method (the CZ method) or the floating zone method (the FZ method). Silicon wafers formed by these methods include lattice defects at a certain rate. The lattice defect is point defects that mainly include an atomic vacancy and an interstitial atom existing in the lattice at about an atom. When these point defects form an aggregate, the aggregate affects the properties of the silicon wafer. Therefore, an annealed wafer, an epitaxial wafer, and a perfect crystal silicon wafer are used for a so-called high-end device for use in communication devices or the like described above.

However, the annealed wafer is a silicon wafer that is annealed in order to remove defects on the surface layer. Moreover, the epitaxial wafer is a silicon wafer formed with an epitaxial layer that the impurity concentration and the thickness are accurately controlled. Namely, since it is necessary to apply secondary processing to a silicon wafer cut out of a silicon ingot both in the annealed wafer and the epitaxial wafer, the number of production steps is increased, and it is difficult to efficiently produce silicon wafers. Furthermore, in the annealed wafer and the epitaxial wafer, there is also a problem in that it is difficult to apply secondary processing described above to a large-diameter silicon wafer.

Because of these reasons, in recent years, a perfect crystal silicon wafer has been promising in which interstitial atoms are removed to leave only atomic vacancies. However, also in the perfect crystal silicon wafer, it is necessary to determine a region of an atomic vacancy-rich portion and a region of an interstitial atom-rich portion in a crystal ingot in order to improve yields. Moreover, also in the region of a single atomic vacancy-rich portion, it is necessary to evaluate the distribution of the concentration of atomic vacancies beforehand.

Therefore, for developing techniques for growing a CZ silicon crystal ingot with point defects controlled, it is necessary to quantitatively evaluate the concentration of atomic vacancies by ultrasonic wave measurement. The concentration of atomic vacancies in the perfect crystal silicon wafer, which is manufactured by slicing the CZ silicon crystal ingot, is evaluated beforehand by ultrasonic wave measurement, whereby it is possible to control properties in manufacturing a device using a perfect crystal silicon wafer, and it is expected to greatly contribute to improving yields.

The present inventors have proposed an atomic vacancy analyzer using ultrasonic wave measurement so far (Patent Document 1). In this atomic vacancy analyzer, ultrasonic waves are caused to pass through a crystal sample while cooling a silicon sample for finding the concentration of atomic vacancies based on an amount of a sharp drop in a curve expressing the relationship between a change in the ultrasonic velocity or a change in ultrasonic wave absorption in the silicon sample and the cooling temperature for the silicon sample. In the silicon sample, an oscillator made of $LiNbO_3$, for example, is bonded to the surface of a silicon wafer, which is a material under test, through an adhesive. An ac voltage is applied to this oscillator, thereby oscillating and receiving ultrasonic wave pulses.

PRIOR ART DOCUMENTS

Patent Document

Patent Document 1: Japanese Patent Application Laid-Open Publication No. 7-174742

DISCLOSURE OF THE INVENTION

Problems to be Solved by the Invention

However, also in the aforementioned Patent Document 1, there was a problem in the atomic vacancy analyzer in that measurement takes a long time in order to variously change the cooling temperature for the silicon sample. Namely, there was a problem in that it takes time to stabilize the states of molecules and atoms in the case where the temperature is changed due to the relationship between the specific heat and the thermal conductions of the silicon sample, so that it is necessary to gently change the temperature for measurement, causing difficulty in efficient evaluation.

Therefore, it is an object of the present invention to provide a quantitative evaluation method, a method for manufacturing a silicon wafer, and a silicon wafer manufactured by the method for manufacturing a silicon wafer that enables one to more efficiently evaluate the concentration of atomic vacancies existing in a silicon wafer.

Solutions to the Problems

According to a first aspect of the present invention is a quantitative evaluation method including steps of: oscillating, in a state in which an external magnetic field is applied to a silicon wafer while keeping the silicon wafer at a constant temperature, an ultrasonic wave pulse and receiving a measurement wave pulse obtained after the ultrasonic wave pulse is propagated through the silicon wafer for detecting a phase difference between the ultrasonic wave pulse and the measurement wave pulse; and calculating an elastic constant from the phase difference, wherein the external magnetic field is changed to calculate the elastic constant corresponding to a change in the external magnetic field for evaluating a concentration of atomic vacancies in the silicon wafer.

According to a second aspect of the present invention, in the first aspect, the ultrasonic wave pulse is a transverse wave.

According to a third aspect of the present invention, in the second aspect, a propagating direction of the ultrasonic wave pulse is a direction [001] of the silicon wafer.

According to a fourth aspect of the present invention is a method for manufacturing a silicon wafer including steps of: oscillating, in a state in which an external magnetic field is applied to a silicon wafer while keeping the silicon wafer at a constant temperature, an ultrasonic wave pulse and receiving a measurement wave pulse obtained after the ultrasonic wave pulse is propagated through the silicon wafer for detecting a phase difference between the ultrasonic wave pulse and the measurement wave pulse; calculating an elastic constant from the phase difference; and evaluating a concentration of atomic vacancies in the silicon wafer by changing the external magnetic field to calculate the elastic constant corresponding to a change in the external magnetic field.

According to a fifth aspect of the present invention, in the fourth aspect, the ultrasonic wave pulse is a transverse wave.

According to a sixth aspect of the present invention, in the fifth aspect, a propagating direction of the ultrasonic wave pulse is a direction [001] of the silicon wafer.

According to a seventh aspect of the present invention is a silicon wafer manufactured according to a manufacturing method, the method including steps of: oscillating, in a state in which an external magnetic field is applied to a silicon wafer while keeping the silicon wafer at a constant temperature, an ultrasonic wave pulse and receiving a measurement wave pulse obtained after the ultrasonic wave pulse is propagated through the silicon wafer for detecting a phase difference between the ultrasonic wave pulse and the measurement wave pulse; and calculating an elastic constant from the phase difference, wherein the external magnetic field is changed to calculate an elastic constant corresponding to a change in the external magnetic field for evaluating a concentration of atomic vacancies in the silicon wafer.

According to an eighth aspect of the present invention, in the seventh aspect, the ultrasonic wave pulse is a transverse wave.

According to a ninth aspect of the present invention, in the eighth aspect, a propagating direction of the ultrasonic wave pulse is a direction [001] of the silicon wafer.

Effects of the Invention

According to the present invention, the external magnetic field to be applied in the state of a constant temperature is changed to measure the amount of the elastic constant changed. Thus, the measuring time can be shortened, so that it is possible to more efficiently evaluate the concentration of atomic vacancies existing in a silicon wafer.

DESCRIPTION OF PREFERRED EMBODIMENTS (1) Quantitative Evaluation Device

A quantitative evaluation device 1 for the concentration of atomic vacancies existing in a silicon wafer according to the present invention will be described with reference to the drawings.

Figure 1:
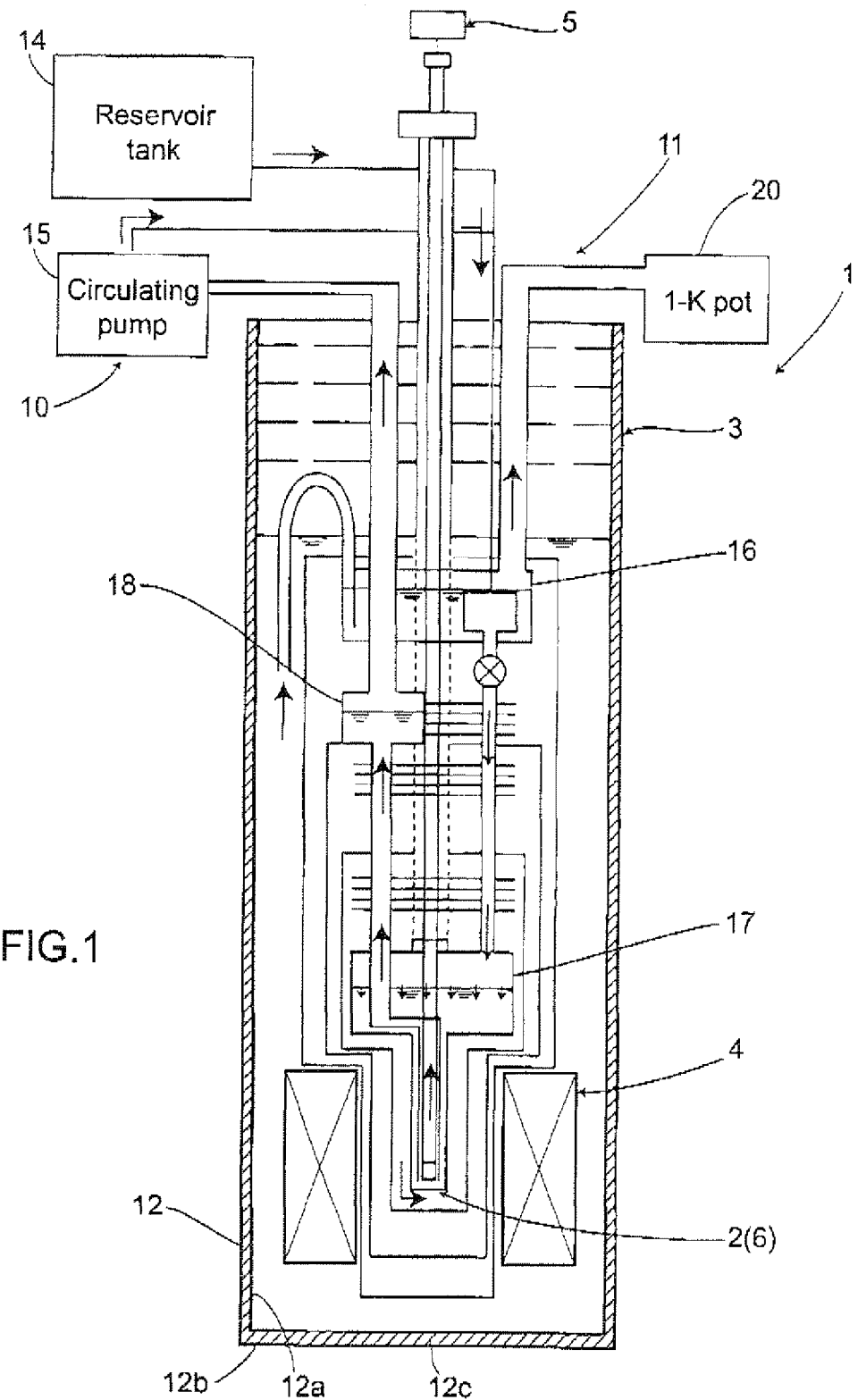
FIG. 1 is a schematic diagram illustrating the overall structure of a quantitative evaluation device.

The quantitative evaluation device 1 shown in FIG. 1 includes a sample holder unit 2, a dilution refrigerator 3 for a cooling unit, a magnetic force generating unit 4, and a detecting unit 5. This quantitative evaluation device 1 is configured overall in which an external magnetic field is changed in a state in which the silicon sample 6 set on the sample holder unit 2 is cooled to a constant temperature to detect the sonic velocity of an ultrasonic wave pulse having propagated through a silicon wafer, described later.

The magnetic force generating unit 4 is disposed around a position at which the silicon sample 6 is set in order to apply an external magnetic field to the silicon sample 6. For the magnetic force generating unit 4, a superconducting magnet, for example, can be used. In the case of this embodiment, since it is sufficient to detect a change in the sonic velocity of the ultrasonic wave pulse in the case of changing the external magnetic field, the magnetic force generating unit 4 is controllable in a range of 0 to 10 teslas (T).

The dilution refrigerator 3 is configured to cool and control the silicon sample 6 set on the sample holder unit 2 in a temperature range of 50 K or less. In the case of this embodiment, the dilution refrigerator 3 is formed of two systems, a $^3$He system 10 and a $^4$He system 11, and configured to cool the inside of a dewar 12 at a predetermined temperature. The dewar 12 has a double structure of an internal layer 12a and an external layer 12b, and a vacuum space 12c is formed between the internal layer 12a and the external layer 12b. A $^4$He liquid is stored in the dewar 12.

The $^3$He system 10 is configured to achieve cooling capacity as the dilution refrigerator 3. The $^3$He system 10 includes a reservoir tank 14, a circulating pump 15, a capacitor 16, a mixer 17, and a separator 18. Different from a typical pump, the circulating pump 15 has a structure in which $^3$He is not released to the outside air. The capacitor 16 cools a $^3$He gas discharged from the circulating pump 15 to obtain a $^3$He liquid.

The mixer 17 is a portion at the lowest temperature in the dilution refrigerator 3. An interface of a phase-separated $^3$He—$^4$He mixed solution exists in the mixer 17. The upper half of the mixer 17 is a $^3$He thick phase, and continuously supplied from the aforementioned capacitor 16. Moreover, the lower half of the mixer 17 is a $^3$He dilute phase (the concentration is about 6%, and the remaining is a superfluid $^4$He), and connected to the separator 18. In the mixer 17, $^3$He is forcedly moved from the thick phase with a large entropy to the dilute phase with almost no entropy. The dilution refrigerator 3 produces cooling capacity by the difference in entropy generated at this time.

The separator 18 is configured to selectively evaporate only $^3$He in the dilute phase. This separator 18 is kept at a predetermined temperature (0.8 K or less, for example). Thus, the separator 18 evaporates only $^3$He using a phenomenon in which the vapor pressure of $^4$He is zero, whereas the vapor pressure of $^3$He is kept finite.

The $^4$He system 11 is configured to liquefy a $^3$He gas. The $^4$He system includes a 1-K pot 20 with a vacuum pump. In the $^4$He system 11, $^4$He in the 1-K pot 20 is evacuated using the vacuum pump, thereby obtaining cooling capacity. This embodiment is configured in which a $^4$He liquid at a temperature of 4.2 K is directly taken out of the inside of the dewar 12 through the capacitor 16 for allowing continuous operation, and a $^3$He gas is liquefied at the capacitor 16.

It is noted that in FIG. 1, although such a configuration is shown in which the sample holder unit 2 on which the silicon sample 6 is set is immersed in the $^3$He—$^4$He mixed solution in the mixer 17 for direct cooling, this embodiment is not limited only to this configuration. For example, such a configuration may be possible in which members constituting the cooled mixer 17 are formed of materials with a high coefficient of thermal conductivity to indirectly cool the silicon sample 6 using the thermal conductions of the members constituting the mixer 17. In the case of such a configuration, it is advantageous in that the cooling temperature range can be particularly increased to the high temperature side.

Figure 2:
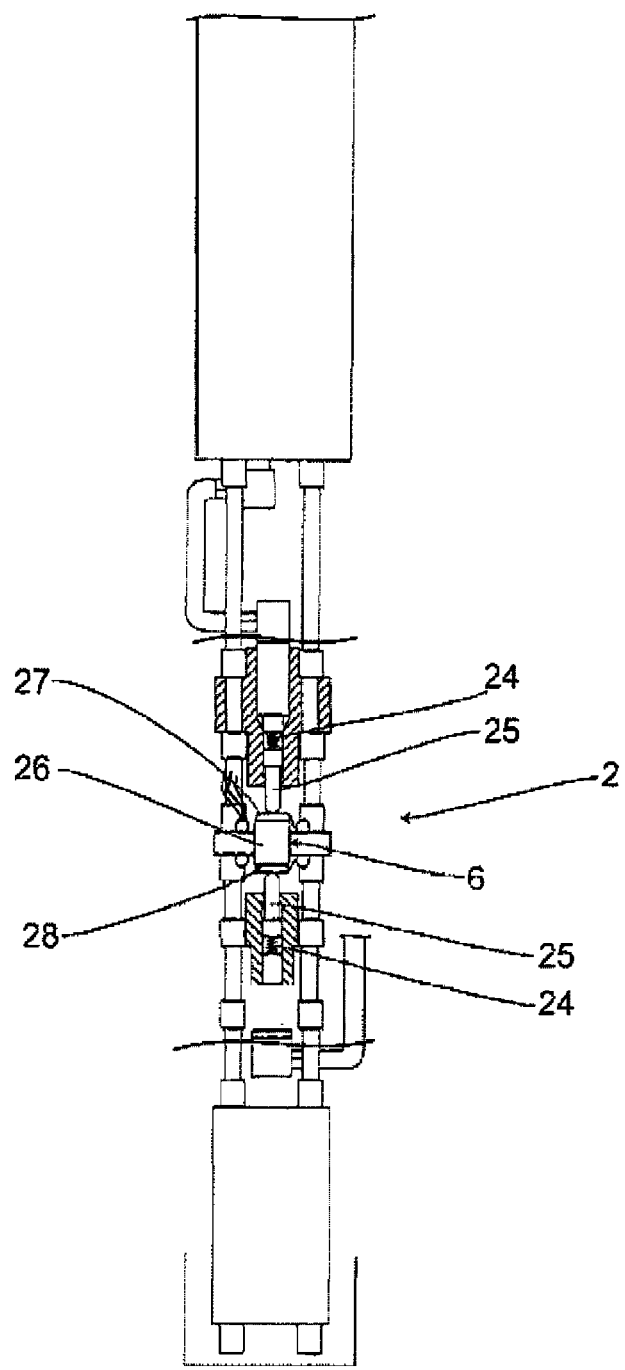
FIG. 2 is an enlarged diagram illustrating a sample holder unit on which a silicon sample is set.

As shown in FIG. 2, the sample holder unit 2 is formed of a pair of pins 25 biased in the axial direction by a coil spring 24. The sample holder unit 2 thus configured holds the silicon sample 6 with the silicon sample 6 sandwiched between the pair of the pins 25.

In the present invention, the silicon sample 6 includes a silicon wafer 26, an ultrasonic wave oscillating unit 27 provided on one surface of the silicon wafer 26, and an ultrasonic wave receiving unit 28 provided on the other surface. This ultrasonic wave oscillating unit 27 and the ultrasonic wave receiving unit 28 include a transducer, described later.

The silicon wafer 26 may be a silicon wafer manufactured by any of the CZ method and the FZ method. Moreover, preferably, the silicon wafer 26 is made of an impurity semiconductor mixed with a dopant. Although various dopants can be considered to be a dopant, B (boron), P (phosphorus), As (arsenic), or the like, for example, can be used.

Figure 3:
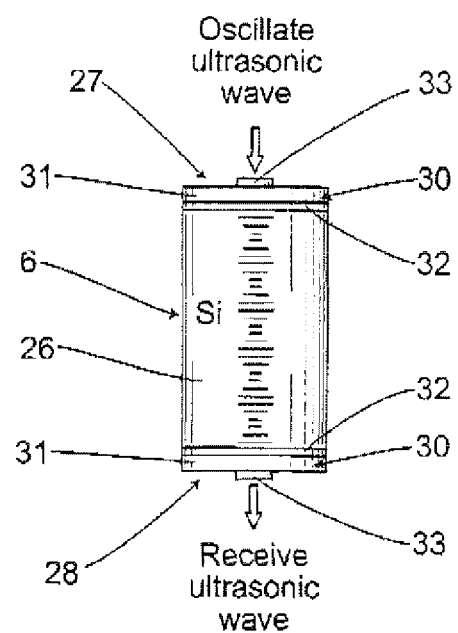
FIG. 3 is a schematic cross sectional view illustrating the configuration of the silicon sample.

As shown in FIG. 3, the transducer 30 includes a thin film oscillator 31 formed in a film and an internal electrode 32 and an external electrode 33 for electrodes to apply an electric field to the thin film oscillator 31.

The thin film oscillator 31 can be made of ZnO (zinc oxide) or MN (aluminum nitride). This thin film oscillator 31 can be formed by physical vapor deposition such as sputtering, for example.

Figure 4:
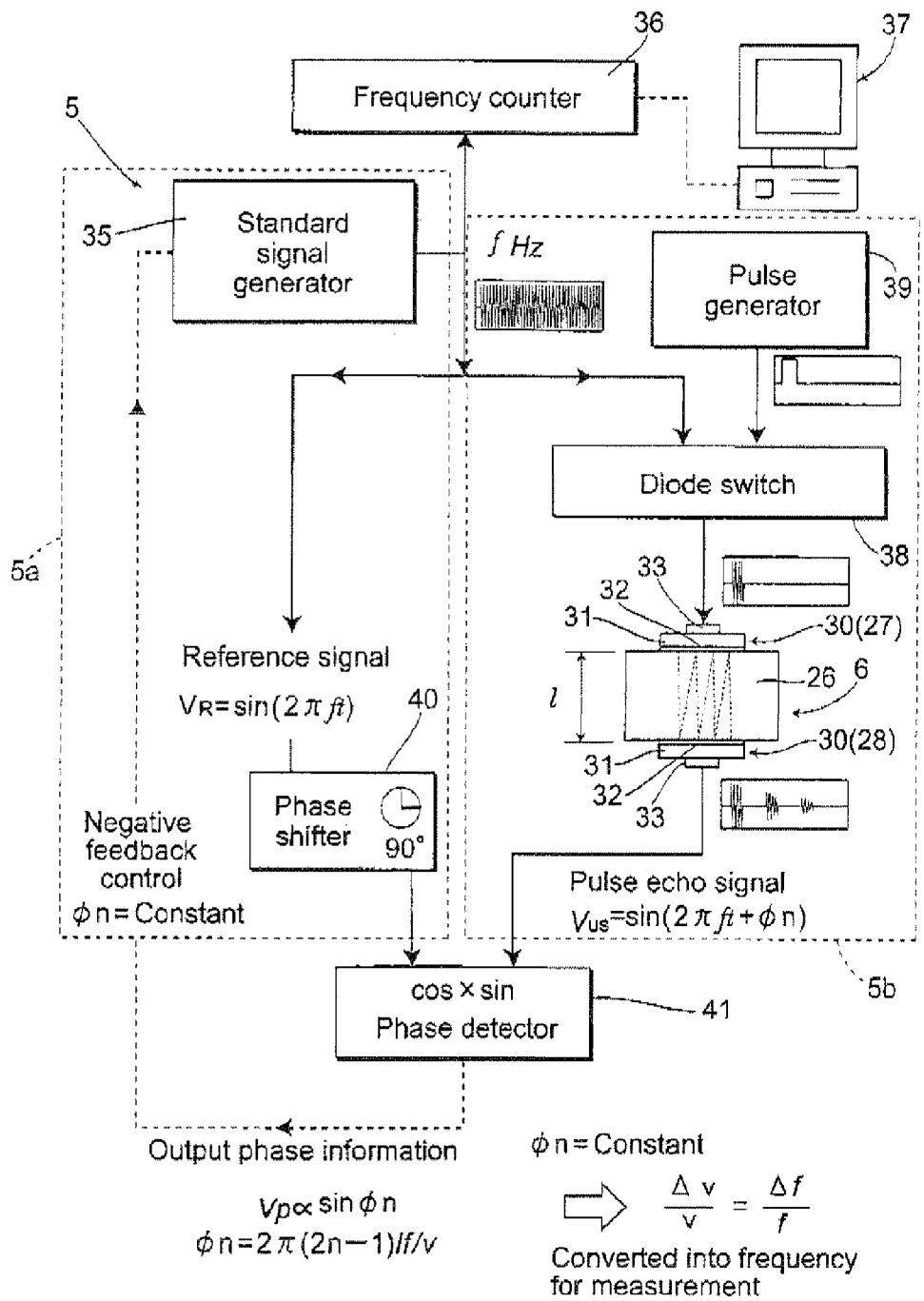
FIG. 4 is a diagram illustrating the overall structure for explaining a method for detecting a phase difference using ultrasonic wave pulses.

The detecting unit 5 shown in FIG. 4 is configured to oscillate an ultrasonic wave pulse to the surface of the silicon wafer, receive a measurement wave pulse obtained after the oscillated ultrasonic wave pulse is propagated through the silicon wafer, and detect a phase difference between the ultrasonic wave pulse and the measurement wave pulse.

In the case of this embodiment, the detecting unit 5 includes a standard signal generator 35, a frequency counter 36, a personal computer 37, a diode switch 38, a pulse generator 39, a phase shifter 40, and a phase detector 41.

The standard signal generator 35 generates a basic signal to be a base of the ultrasonic wave pulse. The basic signal is branched into a reference signal system 5a and a measurement signal system 5b. In addition, the frequency counter 36 measures the basic signal, and outputs the result to the personal computer 37.

The reference signal system 5a is connected to the phase detector 41 through the phase shifter 40. On the other hand, the measurement signal system 5b is in turn disposed with the diode switch 38 connected to the pulse generator 39 and the silicon sample 6, and connected to the phase detector 41. The diode switch 38 divides the basic signal into a predetermined duration.

The phase detector 41 compares the reference signal with the measurement signal outputted from the silicon sample 6, and detects a phase difference.

The detecting unit 5 thus configured can measure the sonic velocity in the silicon wafer 26 in a thickness of 10 mm or less and can reliably distinguish between adjacent pulses using an ultrasonic wave pulse having a pulse duration of 10 μs (microsecond) or less. Moreover, more preferably, the detecting unit 5 includes a unit that changes an oscillation frequency in such a way that a phase difference becomes constant, which is generated by changing the sonic velocity in the external magnetic field, for detecting zero.

Furthermore, preferably, the quantitative evaluation device 1 according to the present invention is configured to simultaneously measure phase differences in a large number of the silicon samples 6 and in a plurality of points on a single silicon sample 6.

(2) Quantitative Evaluation Method

Next, an exemplary method for quantitatively evaluating the concentration of atomic vacancies existing in the silicon wafer 26 according to the present invention will be described below.

In the quantitative evaluation method according to the present invention, first, the silicon sample 6 is cooled to a predetermined temperature in a state in which an external magnetic field is applied, as necessary, to the silicon sample 6 having the ultrasonic wave oscillating unit 27 and the ultrasonic wave receiving unit 28 formed on the surface of the silicon wafer 26 that a predetermined portion is cut out of a silicon ingot.

Subsequently, the standard signal generator 35 oscillates a basic signal. The basic signal is branched into a reference signal system 5a and a measurement signal system 5b. In the reference signal system 5a, the basic signal is inputted as a reference signal to the phase detector 41 through the phase shifter 40. In the measurement signal system 5b, the basic signal is divided into a duration of 0.5 μs (microsecond) by the diode switch 38.

In the transducer 30, an ac electric field as an electric field is applied between the external electrode 33 and the internal electrode 32 using the basic signal divided by the diode switch 38. The ac electric field orients the molecular axis of the thin film oscillator 31 in the direction of the electric field. With this orientation, the thin film oscillator 31 is polarized to exhibit piezoelectric properties, whereby the ultrasonic wave oscillating unit 27 generates ultrasonic wave pulses based on the basic signal. As described above, the basic signal is converted into a mechanical signal, that is, an ultrasonic wave pulse by the transducer 30 of the ultrasonic wave oscillating unit 27.

The ultrasonic wave pulse propagates from one end to the other end of the silicon wafer 26. The ultrasonic wave pulse propagating in the silicon wafer 26 is repeatedly reflected at one end and the other end of the silicon wafer 26, received as a measurement wave pulse at the transducer 30 of the ultrasonic wave receiving unit 28, again converted into an electric signal, and outputted as a measurement signal.

The measurement signal is compared with the reference signal at the phase detector 41 to measure a phase difference $\phi n$ (phi n) between the ultrasonic wave pulse and the measurement wave pulse. A sonic velocity v was calculated from Equation 1 below using this phase difference $\phi n$ (phi n).

$$\phi n = 2\pi(2n-1)l f/v \quad \text{Formula 1}$$

where, (2n−1)l is the propagation length of the nth echo, and f is the ultrasonic frequency.

An elastic constant C was calculated from the sonic velocity v thus calculated according to Equation 2 below.

$$C = \rho v^2 \quad \text{Formula 2}$$

where, $\rho$(rho) is the density.

As described above, the sonic velocity v is sequentially detected using the phase difference $\phi n$ (phi n) of the ultrasonic wave pulse. The elastic constant C is then calculated from the sonic velocity v.

In such measurement on the silicon wafer 26, the elastic constant C is sequentially calculated while changing (increasing) the external magnetic field to be applied in the state of a constant temperature. It is possible to quantitatively evaluate the concentration of atomic vacancies existing in the silicon wafer 26 from the amount of the elastic constant C changed (the increased amount) thus calculated. This is because the amount of the elastic constant changed is proportional to the concentration of atomic vacancies.

Moreover, the elastic constant expressed in the direction of the crystal orientation <100> is as shown in Equation 1. Here, a bulk modulus $C_B$ is as shown in Equation 2. As apparent from this equation, an elastic constant $C_{44}$ is not included in the direction <100>.

$$C_L^{[100]} = C_B + \frac{4}{3}\left(\frac{C_{11} - C_{12}}{2}\right) \quad \text{[Equation 1]}$$

$$C_B = \frac{C_{11} + 2C_{12}}{3} \quad \text{[Equation 2]}$$

Similarly, the elastic constants in the directions of the crystal orientations <110> and <111> are as shown in Equation 3 and Equation 4.

$$C_L^{[110]} = C_B + \frac{1}{3}\left(\frac{C_{11} - C_{12}}{2}\right) + C_{44} \quad \text{[Equation 3]}$$

$$C_L^{[111]} = C_B + \frac{4}{3}C_{44} \quad \text{[Equation 4]}$$

Here, $C_{11}$, $C_{12}$, and $C_{44}$ mean an independent elastic constant of a cubic crystal. As apparent from the equations, in the directions of the crystal orientations <110> and <111>, $C_{44}$ is included, which causes low-temperature softening. The ultrasonic wave pulse is propagated in the direction of the crystal orientation with a high $C_{44}$ ratio, the measurement wave pulse is received at the ultrasonic wave receiving unit, and a phase difference between the ultrasonic wave pulse and the measurement wave pulse is detected for quantitative evaluation, whereby it is possible to more reliably quantitatively evaluate the concentration of atomic vacancies in a wafer.

As described above, in the quantitative evaluation method according to the present invention, the external magnetic field to be applied in the state of a constant temperature was changed for measuring the amount of the elastic constant changed. Thus, the quantitative evaluation method can perform measurement while constantly maintaining the states of molecules and atoms, so that it is possible to save time for stabilizing the states of molecules and atoms, and to shorten measuring time by the time for stabilization as compared with conventional techniques. Therefore, the quantitative evaluation method can more efficiently evaluate the concentration of atomic vacancies existing in the silicon wafer 26.

Moreover, in the quantitative evaluation method, the stability and uniformity of the external magnetic field are high as compared with conventional techniques in which the temperature was changed, so that it is possible to further improve the reproducibility and accuracy of data.

Furthermore, in the quantitative evaluation method, measurement is performed in the state of a constant temperature, so that it is possible to perform measurement using only a dilution refrigerator with a narrow temperature range (a few 10 to 800 mK). Therefore, as compared with conventional techniques necessary to use a helium-3 refrigerator with a wide temperature range (300 mK to 100 K), it is possible to simplify facilities by the refrigerator with a wide temperature range, and to implement low costs.

(3) Examples

Figure 5:
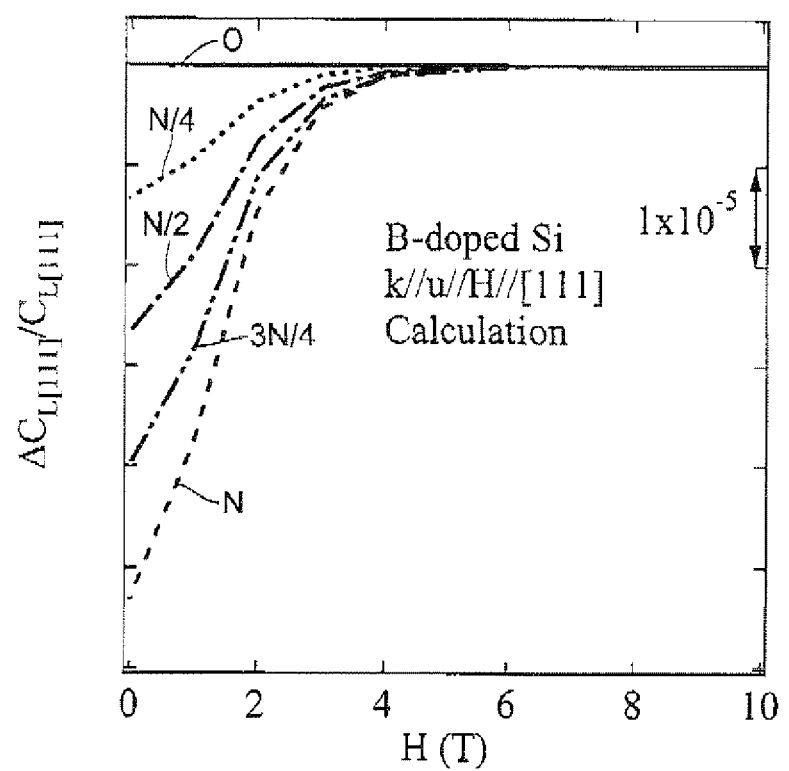
FIG. 5 is a graph illustrating the simulation result in a quantitative evaluation method.

FIG. 5 shows the result of simulating a change in the elastic constant in the case of changing the external magnetic field in the state of a constant temperature in samples at different vacancy concentrations. In the drawing, the horizontal axis expresses the external magnetic field, and the vertical axis expresses a relative change in the elastic constant. It was assumed that the samples were boron-doped silicon. Moreover, Equation 5 was used for simulation.

$$C(T, H) = C_T^0 - \frac{Ng^2 \chi(T, H)}{1 - g' \chi(T, H)} \quad \text{[Equation 5]}$$

$$\xi(T, H) = \frac{1}{k_B T} \frac{\sum_i O_{ii}(H) \exp(-E_i(H)/k_B T)}{\sum_i \exp(-E_i(H)/k_B T)} -$$

$$2 \frac{\sum_i \sum_{i \neq j} \frac{O_{ij}(H)}{E_i - E_j} \exp(-E_i(H)/k_B T)}{\sum_i \exp(-E_i(H)/k_B T)}$$

It is noted that N is the concentration of atomic vacancies, $C_T^0$ is the background, g is the coupling constant of the quadrupole distortion interaction, g' is the coupling constant of the interaction between quadrupoles, T is the temperature, H is the external magnetic field, kB is the Boltzmann constant, E(H) is the energy level in a quantum state, and O(H) is the quadrupole in a quantum state. Moreover, both E(H) and O(H) depend on the external magnetic field. From the simulation result, it was revealed that the elastic constant is systematically changed according to the concentration of atomic vacancies.

Figure 6:
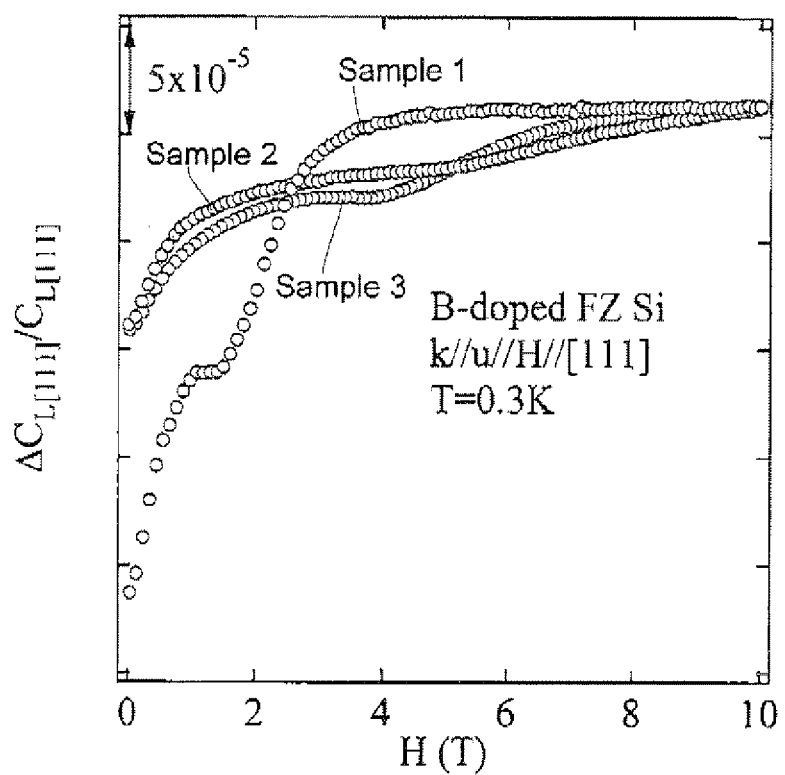
FIG. 6 is a graph illustrating an example in the quantitative evaluation method.

FIG. 6 shows the measured result in the case where a sample is actually set on the quantitative evaluation device 1 shown in FIG. 1 for changing an external magnetic field to be applied to the sample. In the drawing, the horizontal axis expresses the external magnetic field, and the vertical axis expresses a relative change in the elastic constant. As for the sample, boron-doped FZ silicon was used, and a sample 1, a sample 2, and a sample 3 were prepared, which were cut out of an ingot at different positions. The cooling temperature was 0.3 K (at constant). Moreover, the external magnetic field was applied to the sample in the direction <111>. The thin film oscillator was formed by depositing ZnO by sputtering.

From this result, it could be confirmed that the concentration of atomic vacancies of the sample 1 is about two times that of the sample 2 and the sample 3. Namely, it could be confirmed that the concentration of atomic vacancies can be evaluated from the amount of the elastic constant changed, which was measured by changing the external magnetic field to be applied to the sample in a state in which the temperature of the sample is kept at constant.

(4) Exemplary Modifications

The description above shows only an example of this embodiment of the present invention. This embodiment can be modified and altered variously in the scope of the appended claims.

Moreover, the thin film oscillator 31 is explained in the case where it is made of ZnO or AlN. However, the present invention is not limited thereto. The thin film oscillator 31 may be made of a polymeric material with a large electric dipole efficiency in molecular chains, in which an electric field is applied to orient the dipole in the direction of the electric field (polling). This thin film oscillator 31 is formed by solidifying a liquid polymeric material having physical properties that can follow the expansion of a silicon wafer in association with a temperature drop in the temperature range and having properties that the liquid polymeric material is solidified by reducing the temperature in the state in which an electric field is applied to orient the molecular axis in the direction of the electric field and at the same time the orientation (electric polarization) of the molecular axis is maintained even after removing the electric field. Here, the molecular axis refers to a pair of positive and negative sources provided apart from a micro distance. Moreover, orientation is performed in a high temperature heating state at a temperature of 50° C. or more and 500° C. or less. Furthermore, the physical properties that can follow the expansion of the silicon wafer 26 mean that peeling can be prevented by the thin film oscillator 31 to absorb stress caused by volume expansion in the case where the temperature of the silicon wafer 26 is set at a low temperature.

The thin film oscillator 31 is made of a polymeric material, whereby it is possible to form the thin film oscillator 31 by spin coating, for example. Thus, as compared with the case of forming a ZnO thin film by physical vapor deposition such as sputtering, a uniform thin film can be formed for a short time.

For a material of forming the thin film oscillator 31, a polymer (PVDF) of vinylidene fluoride $CH_2CF_2$(VDF), a copolymer (P(VDF/TrFE)) of VDF and ethylene trifluoride $CHFCF_2$(TrFE), a copolymer (P(VDF/TeFE)) of VDF and ethylene tetrafluoride $CF_2CF_2$(TeFE), an alternating copolymer (P(VDCN/VAc)) of vinylidene cyanide $CH_2C(CN)_2$ (VDCN) and vinyl acetate $CH_2CHOCOCH_3$ (VAc), a condensation polymer (NHCONH—R—NHCONH—R')n of diamine and di-isocyanate (R, R' are aromatics, PU (polyurea)), and fluorine resins can be applied.

Moreover, in the aforementioned embodiment, the case is explained where the thin film oscillator 31 is made of ZnO (zinc oxide) or MN (aluminum nitride). However, the present invention is not limited thereto. The thin film oscillator can be formed of a crystal piece that a single crystal with piezoelectric properties is cut in a predetermined orientation and an electrode provided on the crystal piece. A single crystal with piezoelectric properties is a quartz crystal, $LiNbO_3$, $LiTaO_3$, or the like, for example. For example, in the case of using $LiNbO_3$, a 36-degree Y-cut or X-cut crystal piece is used. The thin film oscillator thus configured can be bonded to a silicon wafer using an adhesive, such as epoxies, silicones, acrylics, and polysulfides, for example. In the present invention, an adhesive will not peel off from a silicon wafer due to a temperature change as in the conventional techniques because the concentration of atomic vacancies in the silicon wafer is evaluated by a change in the magnetic field while keeping the silicon wafer at a constant temperature. Furthermore, the thin film oscillator can be bonded to the silicon wafer also by compression bonding or joining using a metal film such as gold or indium. The thin film oscillator thus configured can generate an ultrasonic wave pulse of a transverse wave. The transverse wave refers to an ultrasonic wave with a displacement direction vertical to the propagating direction. In this connection, the longitudinal wave refers to an ultrasonic wave with a displacement direction parallel with the propagating direction. As for a silicon crystal belonging to a cubic crystal, the elastic constant $C_{44}$ can be measured from a transverse ultrasonic wave with a propagating direction [001] and a displacement direction [100], for example, and $(C_{11}-C_{12})/2$ can be measured from a transverse ultrasonic wave with a propagating direction [110] and a displacement direction [1-10]. An $LiNbO_3$ thin film oscillator is used, the ultrasonic wave pulse is a transverse wave, and the propagating direction of the pulse is [001], whereby the elastic constant $C_{44}$ can be directly measured. The elastic constant $C_{44}$ can be measured using the ultrasonic wave pulse of a transverse wave, so that it is possible to highly accurately measure the degree of low-temperature softening proportional to the concentration of atomic vacancies. This is because a large low-temperature softening appears in $C_{44}$ purer than $C_{L[111]}$ including $C_B$ expressing a constant value at a low temperature as low-temperature softening due to the atomic vacancy track appears in $C_{44}$ obtained by the ultrasonic wave pulse of a transverse wave. For example, the elastic constant $C_{L[111]}$ obtained by a longitudinal ultrasonic wave propagating in the direction [111] includes components $C_B$ and $C_{44}$. In conjunction therewith, the elastic constant $C_{44}$ can be directly measured as the ultrasonic wave pulse is a transverse wave and the propagating direction of the ultrasonic wave pulse is the direction [001] of the silicon wafer, so that it is possible to perform easy measurement by simply bonding the thin film oscillator to a [100] silicon wafer presently generally used in semiconductor manufacturing processes with no special processing applied to the [100] silicon wafer.

Figure 7:
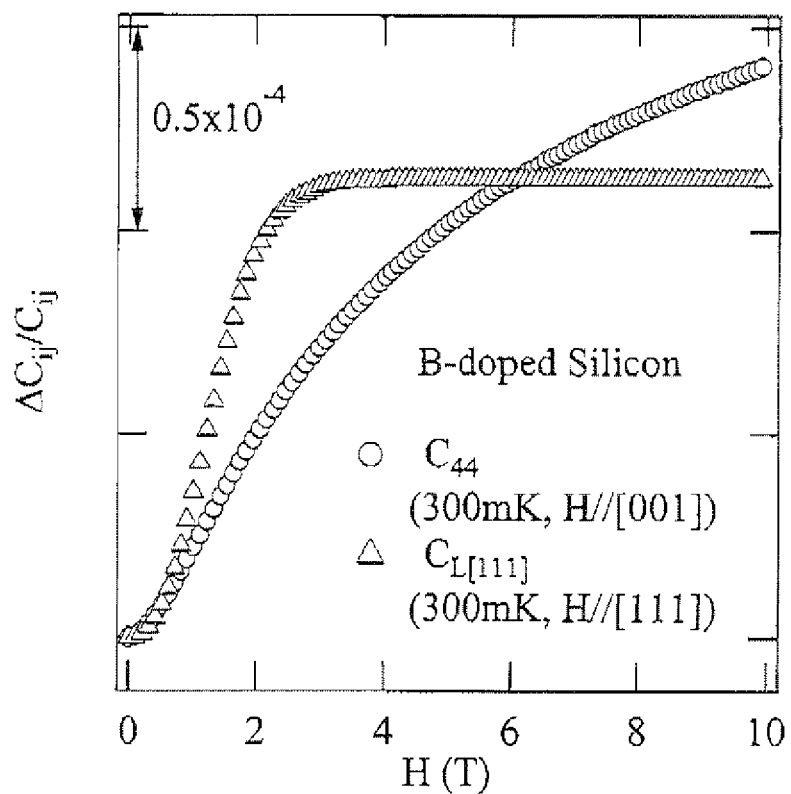
FIG. 7 is a graph illustrating the simulation result in a quantitative evaluation method according to an exemplary modification.

FIG. 7 shows the result of simulating a change in the elastic constant in the case of changing the external magnetic field in the state of a constant temperature. In the drawing, the horizontal axis expresses the external magnetic field, and the vertical axis expresses a relative change in the elastic constant. It was assumed that the samples were boron-doped silicon. From the simulation result, it was revealed that a change is larger in the elastic constant $C_{44}$ than in the elastic constant $C_{L[111]}$.

Figure 8:
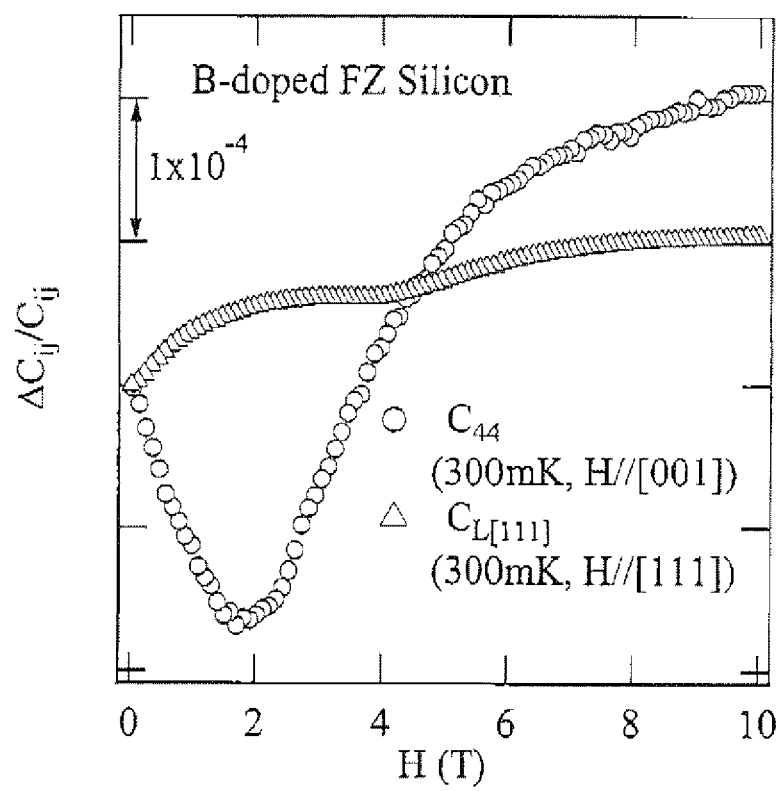
FIG. 8 is a graph illustrating the result in a quantitative evaluation method according to an exemplary modification.

FIG. 8 shows the measured result in the case where a sample according to the exemplary modification is actually set on the quantitative evaluation device 1 shown in FIG. 1 for changing the external magnetic field to be applied to the sample. In the drawing, the horizontal axis expresses the external magnetic field, and the vertical axis expresses a relative change in the elastic constant. Boron-doped FZ silicon was used for samples. As for a sample 1, it is the measured result in the case where a thin film oscillator including an electrode on an $LiNbO_3$ crystal piece was bonded using an adhesive. In this case, the ultrasonic wave pulse is a transverse wave, and the propagating direction is [001]. As for a sample 2, it is the measured result in the case where a thin film oscillator was formed by depositing ZnO by sputtering. In this case, the ultrasonic wave pulse is a longitudinal wave, and the propagating direction is [111]. The cooling temperature was a temperature of 0.3 K (300 mK at constant). Moreover, an external magnetic field was applied to the sample 1 in the direction <001>, and to the sample 2 in the direction <111>.

From this result, it could be confirmed that a change in the elastic constant is larger in the sample 1 than in the sample 2 and that it is possible to highly accurately measure the degree of low-temperature softening proportional to the concentration of atomic vacancies in the sample 1.

DESCRIPTION OF REFERENCE SIGNS

1 Quantitative evaluation device
3 Dilution refrigerator (cooling unit)
4 Magnetic force generating unit
5 Detecting unit
6 Silicon sample
26 Silicon wafer
27 Ultrasonic wave oscillating unit
28 Ultrasonic wave oscillating unit
30 Transducer
31 Thin film oscillator
32 Internal electrode (electrode)
33 External electrode (electrode)

The invention claimed is:

1. A quantitative evaluation method comprising steps of:
    oscillating, in a state in which an external magnetic field is applied to a silicon wafer while keeping the silicon wafer at a constant temperature, an ultrasonic wave pulse and receiving a measurement wave pulse obtained after the ultrasonic wave pulse is propagated through the silicon wafer for detecting a phase difference between the ultrasonic wave pulse and the measurement wave pulse; and
    calculating an elastic constant from the phase difference,
    wherein the external magnetic field is changed in a constant temperature state to measure an amount of the elastic constant changed corresponding to a change in the external magnetic field for evaluating a concentration of atomic vacancies in the silicon wafer, based on a relationship $$C(T, H) = C_T^0 - \frac{Ng^2 \chi(T, H)}{1 - g' \chi(T, H)}$$

$$\chi(T, H) = \frac{1}{k_B T} \frac{\sum_i O_{ii}(H) \exp(-E_i(H)/k_B T)}{\sum_i \exp(-E_i(H)/k_B T)} - 2 \frac{\sum_{ij} \sum_{i \neq j} \frac{O_{ij}(H)}{E_i - E_j} \exp(-E_j(H)/k_B T)}{\sum_i \exp(-E_i(H)/k_B T)}$$

wherein C(T,H) is an elastic constant, N is a concentration of atomic vacancies, $C^0_T$ is a background, g is a coupling constant of a quadrupole distortion interaction, g' is a coupling constant of an interaction between quadrupoles, T is a temperature, H is an external magnetic field, kB is a Boltzmann constant, E(H) is energy level in a quantum state, and O(H) is a quadrupole in a quantum state.

2. The quantitative evaluation method according to claim 1, wherein the ultrasonic wave pulse is a transverse wave.

3. The quantitative evaluation method according to claim 2, wherein a propagating direction of the ultrasonic wave pulse is a direction [001] of the silicon wafer.

4. A method for manufacturing a silicon wafer comprising steps of:
    oscillating, in a state in which an external magnetic field is applied to a silicon wafer while keeping the silicon wafer at a constant temperature, an ultrasonic wave pulse and receiving a measurement wave pulse obtained after the ultrasonic wave pulse is propagated through the silicon wafer for detecting a phase difference between the ultrasonic wave pulse and the measurement wave pulse;
    calculating an elastic constant from the phase difference; and
    evaluating a concentration of atomic vacancies in the silicon wafer by changing the external magnetic field in a constant temperature state to measure an amount of the elastic constant changed corresponding to a change in the external magnetic field, based on a relationship $$C(T, H) = C_T^0 - \frac{Ng^2 \chi(T, H)}{1 - g' \chi(T, H)}$$

$$\chi(T, H) = \frac{1}{k_B T} \frac{\sum_i O_{ii}(H) \exp(-E_i(H)/k_B T)}{\sum_i \exp(-E_i(H)/k_B T)} - 2 \frac{\sum_j \sum_{i \neq j} \frac{O_{ij}(H)}{E_i - E_j} \exp(-E_j(H)/k_B T)}{\sum_i \exp(-E_i(H)/k_B T)}$$

wherein C(T,H) is an elastic constant, N is a concentration of atomic vacancies, $C^0_T$ is a background, g is a coupling constant of a quadrupole distortion interaction, g' is a coupling constant of an interaction between quadrupoles, T is a temperature, H is an external magnetic field, kB is a Boltzmann constant, E(H) is energy level in a quantum state, and O(H) is a quadrupole in a quantum state.

5. The method for manufacturing a silicon wafer according to claim 4,
    wherein the ultrasonic wave pulse is a transverse wave.

6. The method for manufacturing a silicon wafer according to claim 5,
    wherein a propagating direction of the ultrasonic wave pulse is a direction [001] of the silicon wafer.

* * * * *